(12) United States Patent
Li et al.

(10) Patent No.: US 10,726,940 B2
(45) Date of Patent: Jul. 28, 2020

(54) COLUMN SKIP INCONSISTENCY CORRECTION

(71) Applicant: SanDisk Technologies LLC, Addison, TX (US)

(72) Inventors: Zhuojie Li, Milpitas, CA (US); Hua-Ling Cynthia Hsu, Fremont, CA (US); Yen-Lung Li, San Jose, CA (US); Min Peng, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/239,517

(22) Filed: Jan. 3, 2019

(65) Prior Publication Data

US 2020/0082897 A1    Mar. 12, 2020

Related U.S. Application Data

(60) Provisional application No. 62/728,786, filed on Sep. 8, 2018.

(51) Int. Cl.
*G11C 29/00* (2006.01)
*G11C 16/10* (2006.01)
*G06F 11/10* (2006.01)

(52) U.S. Cl.
CPC ........ *G11C 29/808* (2013.01); *G06F 11/1016* (2013.01); *G11C 16/10* (2013.01); *G11C 29/00* (2013.01); *G11C 29/70* (2013.01); *G11C 29/848* (2013.01); *G06F 2212/1008* (2013.01)

(58) Field of Classification Search
CPC ..... G11C 29/70; G11C 29/808; G11C 29/848; G06F 11/1016; G06F 2212/1008
See application file for complete search history.

(56) References Cited

U.S. PATENT DOCUMENTS

| | | | |
|---|---|---|---|
| 6,243,305 B1 * | 6/2001 | Brady | G11C 29/78 365/185.09 |
| 7,170,802 B2 | 1/2007 | Cernea et al. | |
| 7,366,042 B2 | 4/2008 | Sukegawa | |
| 8,949,694 B2 * | 2/2015 | Nicholas | G06F 11/1016 714/768 |
| 10,430,117 B2 * | 10/2019 | Jean | G06F 12/0246 |
| 2011/0069549 A1 | 3/2011 | Tokiwa | |
| 2014/0157087 A1 | 6/2014 | Yurzola et al. | |
| 2016/0124664 A1 | 5/2016 | Sabde et al. | |

* cited by examiner

*Primary Examiner* — Vanthu T Nguyen
(74) *Attorney, Agent, or Firm* — Vierra Magen Marcus LLP

(57) ABSTRACT

Apparatuses, systems, and methods are disclosed for skip inconsistency correction. A skip circuit is configured to skip memory units for read operations and write operations of a memory array, based on a record of memory units identified as faulty. A skip inconsistency detection circuit is configured to detect a skip inconsistency in read data from a memory array. A correction circuit is configured to correct a skip inconsistency and output corrected read data.

20 Claims, 9 Drawing Sheets

COLUMN SKIP INCONSISTENCY CORRECTION

This application claims the benefit of U.S. Provisional Patent Application No. 62/728,786 entitled "SELF-CORRECTION FOR INCONSISTENT COLUMN SKIP" and filed on Sep. 8, 2018, for Zhuojie Li et al., which is incorporated herein by reference.

TECHNICAL FIELD

The present disclosure, in various embodiments, relates to column skipping for non-volatile memory and more particularly relates to correcting inconsistencies in column skipping.

BACKGROUND

Columns or other memory units within a memory device may include defects that prevent data from being accurately written or read. Defects may occur during manufacturing of memory chips or dies, or may arise over time as memory is used. Bad or defective columns or other memory units may be skipped when reading and writing data. However, defects in the skipping mechanism may cause a memory controller to write to or read from a column that has been marked for skipping. Inconsistent skipping can cause data errors.

SUMMARY

Apparatuses are presented for skip inconsistency correction. An apparatus, in one embodiment, includes a skip circuit configured to skip memory units for read operations and write operations of a memory array, based on a record of memory units identified as faulty. In a certain embodiment, a skip inconsistency detection circuit is configured to detect a skip inconsistency in read data from a memory array. In a further embodiment, a correction circuit is configured to correct a skip inconsistency and output corrected read data.

Systems are presented for skip inconsistency correction. A system, in one embodiment, includes a memory die and a die controller. In a certain embodiment, a memory die includes a non-volatile memory array. In one embodiment, a die controller is configured to write data in to memory cells of an array and shift the data stored in the array to avoid bad columns of the array based on a bad column register. In a certain embodiment, a die controller is configured to detect a superfluous data value in data read from an array. In a further embodiment, a superfluous data value may indicate that a column avoided when writing data was unskipped when the data was read. In one embodiment, a die controller is configured to output corrected read data with a superfluous data value removed.

An apparatus, in another embodiment, includes means for skipping faulty columns of a memory array in read operations and write operations for the memory array. In a certain embodiment, an apparatus includes means for detecting a column skip inconsistency in data of a read operation. In a further embodiment, an apparatus includes means for correcting a column skip inconsistency and outputting corrected data.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
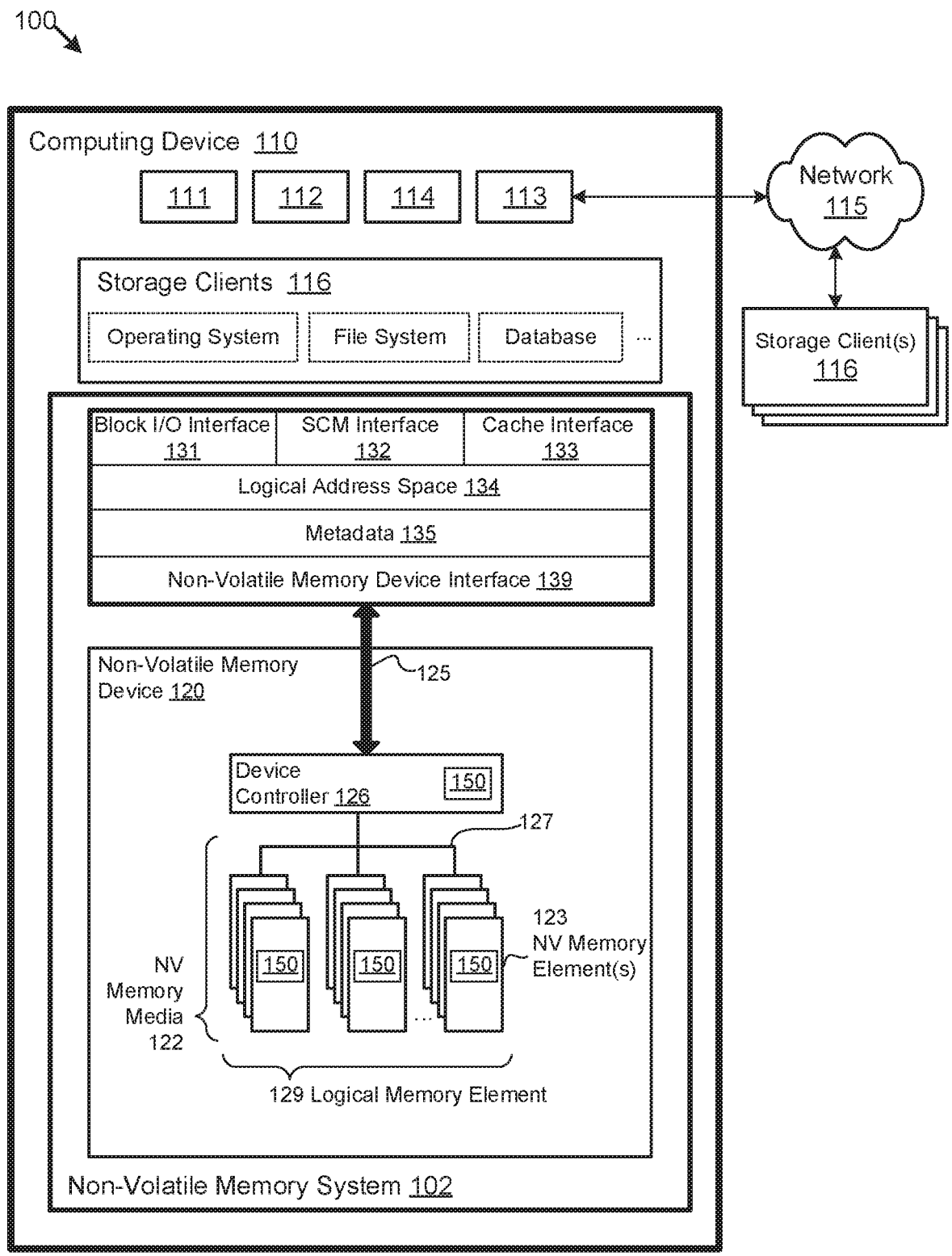
FIG. 1 is a schematic block diagram illustrating one embodiment of a system comprising non-volatile memory elements.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C #, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include an integrated circuit, a portion of an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more skip components 150 for a non-volatile memory device 120. Skip components 150 may be part of one or more non-volatile memory elements 123, a device controller 126 external to the non-volatile memory elements 123, a device driver, or the like. Skip components 150 may be part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a Serial Advanced Technology Attachment (SATA) bus, a Parallel Advanced Technology Attachment (PATA) bus, a Small Computer System Interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a Storage Area Network (SAN), a Local Area Network (LAN), a Wide Area Network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the skip component 150 may be embodied as one or more computer readable instructions stored on the non-transitory storage media 114.

The non-volatile memory system 102, in the depicted embodiment, includes one or more skip components 150. A skip component 150, in one embodiment, may skip memory units for read operations and write operations of a memory array, based on a record of memory units identified as faulty. In certain embodiments, a skip component 150 may detect a skip inconsistency in read data from a memory array, correct the skip inconsistency, and output corrected read data.

Various types of memory may include faulty memory units, such as faulty rows, faulty columns, faulty pages, or the like. Units may be faulty due to defects that arise during manufacturing or may become faulty over time due to wear. Faulty memory units may store data inconsistently. For example, data that is read from a faulty memory unit may not be the same data that was stored in the faulty memory unit. A skip component 150 may maintain or use a record or list of faulty memory units and may skip the faulty units during read and write operations. Skipping faulty memory units may prevent the faulty memory units from corrupting data or causing data errors.

However, if the skipping itself is faulty or inconsistent, skip inconsistencies may cause data errors. For example, if the skip component 150 skips a column when writing a stream of data to a non-volatile memory element 123 but does not skip that column when reading the data, then extra data from the bad column may be introduced, shifting subsequent data backward in the data stream. As another example, if the skip component 150 skips a column when reading a stream of data from a non-volatile memory element 123 but did not skip that column when writing the data, then data from the skipped column may be missing, shifting subsequent data forward in the data stream. In either case, correct data in an incorrect position may be equivalent to incorrect data. For example, encoding data using an error-correcting code prior to writing may allow a limited number of errors to be corrected when the data is read and decoded, but shifting a portion of the data out of position when the data is read may make the data uncorrectable (e.g., may prevent a decoder from decoding the data).

Thus, in certain embodiments, a skip component 150 that detects and corrects skip inconsistencies may avoid errors and may re-align or unshift misaligned or shifted portions of data. A skip component 150 may output read data with skip inconsistencies corrected. At times, read data with skip inconsistencies corrected may contain errors other than skip inconsistencies, but correcting the skip inconsistencies may increase the likelihood that other errors will be correctable by an error-correcting code decoder. Skip components 150 are described in greater detail below with regard to FIGS. 2-11.

In one embodiment, a skip component 150 may include logic hardware of one or more non-volatile memory devices 120, such as a device controller 126, a non-volatile memory element 123, other programmable logic, firmware for a non-volatile memory element 123, microcode for execution by a non-volatile memory element 123, or the like. In another embodiment, a skip component 150 may include executable software code, stored on a computer readable storage medium for execution by logic hardware of a computing device 110, a device controller 126, and/or a non-volatile memory element 123. In a further embodiment, a skip component 150 may include a combination of both executable software code and logic hardware.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), a cache line address, a memory address, a cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical-to-physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the storage class memory (SCM) interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, a fabric, Infiniband, Ethernet, Omnipath, GenZ, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: Resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, or may use block-level erase operations, storage class memory, in one embodiment, may be byte addressable, and may provide byte-level read and write operations (e.g., write operations may include byte-level program and byte-level erase operations, or may include byte-level write operations capable of overwriting data in place without a previous erase operation). In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
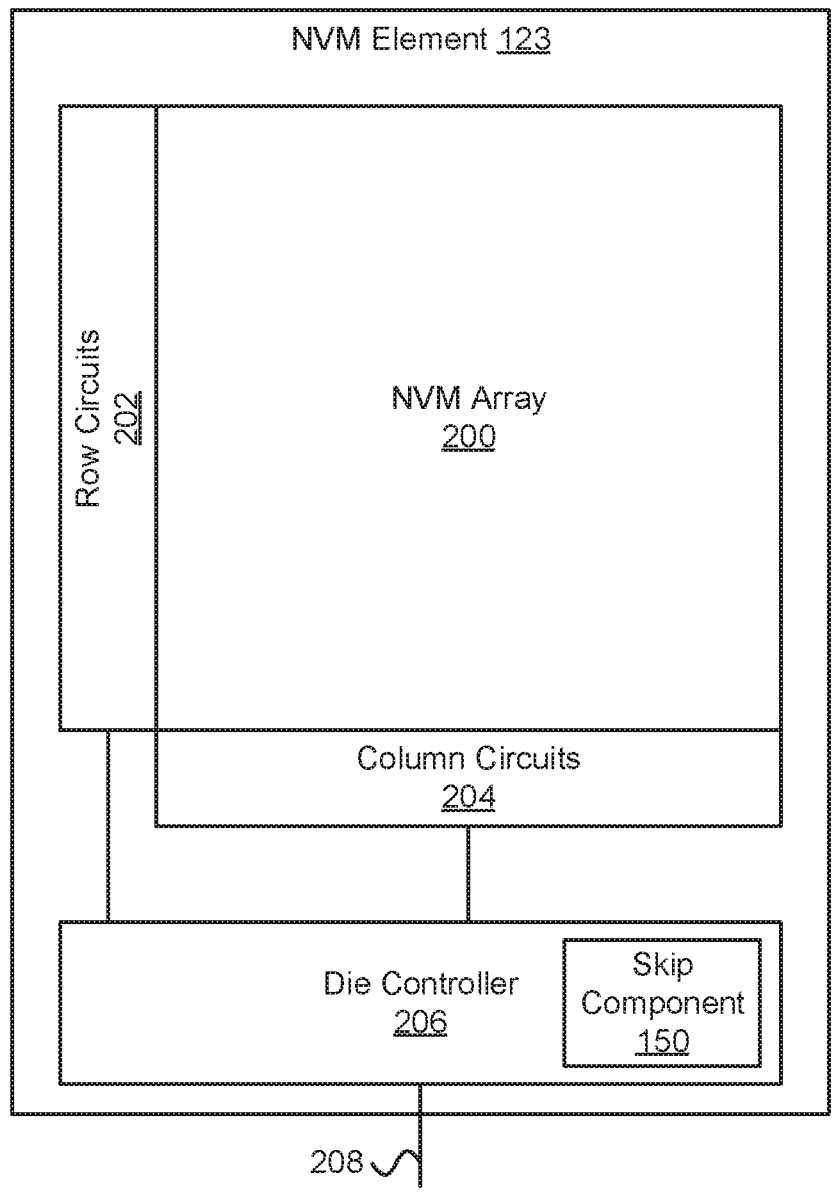
FIG. 2 is a schematic block diagram illustrating one embodiment of a non-volatile memory element.

FIG. 2 depicts one embodiment of a non-volatile memory element 123. The non-volatile memory element 123 may be substantially similar to the non-volatile memory element 123 described with reference to FIG. 1. The non-volatile memory element 123, in the depicted embodiment, includes a non-volatile memory array 200, row circuits 202, column circuits 204, and a die controller 206.

In various embodiments, a non-volatile memory element 123 may be an integrated circuit (e.g., a chip or die) that includes both a core non-volatile memory array 200 for data storage, and peripheral components (e.g., row circuits 202, column circuits 204, and/or a die controller 206) for communicating with the array 200. In certain embodiments, one or more non-volatile memory elements 123 may be included in a memory module, a storage device, or the like. Although a non-volatile memory element 123 including an array 200 of non-volatile memory cells is depicted, the disclosure is not limited in this regard. In another embodiment, a system may include one or more memory die, which may be integrated circuits including one or more volatile and/or non-volatile memory arrays 200, which in turn may include volatile and/or non-volatile memory cells. A skip component 150 may detect and correct skip inconsistency errors for volatile and/or non-volatile memory.

In the depicted embodiment, the non-volatile memory array 200 includes a plurality of non-volatile memory cells for storing data. In one embodiment, the array 200 may be a two-dimensional array. In another embodiment, the array 200 may be a three-dimensional array that includes multiple planes and/or layers of non-volatile memory cells. Memory cells, in various embodiments, may be the individual physical units of data storage for a memory array 200, such as floating gate transistors for Flash memory, magnetic tunnel junctions for MRAM memory, resistors with changeable resistance for ReRAM, or the like. In various embodiments, the array 200 may be addressable by rows via row circuits 202, and by columns via column circuits 204.

The die controller 206, in the depicted embodiment, is disposed on the same non-volatile memory element 123 or memory die as the array 200. By contrast, a device controller 126 as described above with reference to FIG. 1, may be external to a non-volatile memory element 123 or memory die, and may communicate with a set of one or more non-volatile memory elements 123 or memory dies to read and write data.

The die controller 206, in certain embodiments, cooperates with the row circuits 202 and the column circuits 204 to perform memory operations on the array 200. In various embodiments, the die controller 206 may include components such as a power control circuit that controls the power and voltages supplied to the row circuits 202 and column circuits 204 during memory operations, an address decoder that translates a received address to a hardware address used by the row circuits 202 and column circuits 204, a state machine that implements and controls the memory operations, and the like. The die controller 206 may communicate with a computing device 110, a processor 115, a bus controller, a device controller 126, a memory module controller, or the like, via line 208, to receive command and address information, transfer data, or the like.

In certain embodiments, word lines couple row circuits 202 to rows of cells, and bit lines couple column circuits 204 to columns of cells. Thus, in one embodiment, to write data to a row of the array 200, the die controller 206 may use row circuits 202 to apply write pulses or a write voltage to a word line, and may use column circuits 204 to apply program or inhibit voltages to bit lines for cells in the row, corresponding to writing a 0 or a 1 to the cells. In a further embodiment, to read data from a row of the array 200, the die controller 206 may use row circuits 202 to apply read pulses or a read voltage to a word line and may use column circuits 204 to sense voltages or currents at bit lines for cells in the row, to determine what data is stored. Various other or further ways of writing or reading data to or from cells in rows, columns, planes, and/or other units of an array 200 will be clear. The term "word line" may be used herein to refer to a conductor that couples cells to row circuits 202, or to the cells that are coupled to the conductor. Similarly, the term "bit line" may be used herein to refer to a conductor that couples cells to column circuits 204, or to the cells that are coupled to the conductor.

In the depicted embodiment, the die controller 206 includes a skip component 150, which may be substantially similar to the skip components 150 described with reference to FIG. 1. In certain embodiments, the die controller 206 may write data to the array 200, or read data from the array 200, and the skip component 150 may skip memory units such as columns, rows, or pages during read and write operations performed by the die controller 206. In further embodiments, the skip component 150 may detect a skip inconsistency in data read from the array 200 by the die controller 206, correct the skip inconsistency, and output corrected read data.

In various embodiments, detecting and correcting skip inconsistencies may be done by a skip component 150 of a die controller 206 for a non-volatile memory element 123, and/or may be done by a skip component 150 of a device driver or device controller 126 for a non-volatile memory device 120. In another embodiment, a skip component 150 may include portions of a device driver, a device controller 126, one or more die controllers 206, and/or the like.

Figure 3:
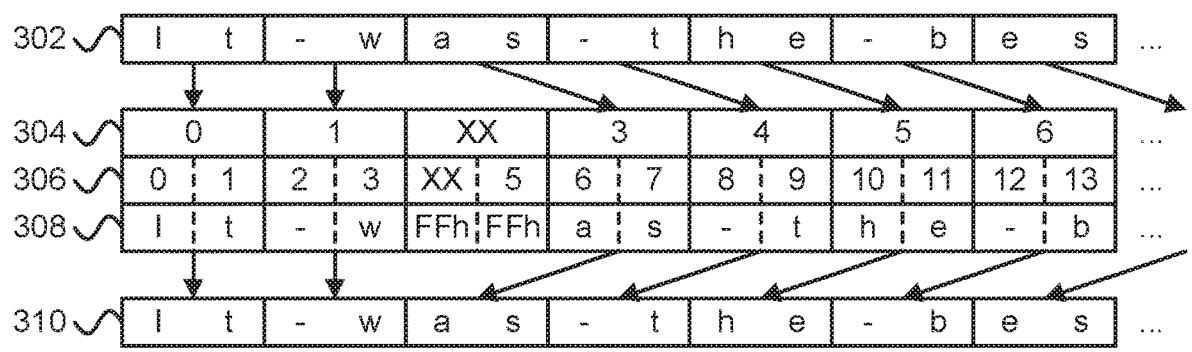
FIG. 3 is a schematic block diagram illustrating one embodiment of operations with column skipping.

FIG. 3 depicts one embodiment of operations 300 with column skipping. In the depicted embodiment, a memory array 200 includes words 304 and columns 306, which store data 308. A word 304, in various embodiments, may be two bytes of data (as shown in FIG. 3), or may be a data unit of another size, corresponding to the width of an input/output bus for a non-volatile memory element 123, the width of an internal bus for a non-volatile memory element 123, a width of an input or output queue for a non-volatile memory element 123, or the like. In certain embodiments, the term "word" may refer to a unit of data, as described above, and/or may refer to a memory unit or subdivision of a memory array 200 that stores a data word. In the depicted embodiment, words 304 are numbered from zero to six, for convenience in describing which words 304 of the memory array 200 store which values of data 308.

A column 306, in one embodiment, may refer to a bit line, or to cells coupled together by a bit line. In another embodiment, a column 306 may refer to a set of bit lines. For example, in the depicted embodiment, eight bit lines may be managed as a group, so that skipping a column 306 involves skipping eight bit lines (and possibly storing some data in a spare or redundant column 306 of eight bit lines). In another embodiment, a column 306 may include more or fewer than eight bit lines. Additionally, the term "column" may be used herein to refer to the cells of a shared bit line or set of bit lines, or to those cells where they intersect a row or word line. For example, when writing data to a row of an array 200, the data may be referred to as being written to columns 306 such as column 0, column 1, column 2, and so on, even if no data is being written to cells of those columns 306 that do not intersect the row. Thus, in the depicted embodiment, the term "column" may refer to cells for a set of eight bit lines or may refer to eight cells where those eight bit lines intersect a row.

In the depicted embodiment, columns 306 store eight bits, so that a sixteen bit word 304 is written to two columns 306. Columns 306 are depicted as numbered from zero to thirteen for convenience in describing which columns 306 store which values of data 308. Thus, in the depicted embodiment, word 0 includes cells of columns 0 and 1, word 1 includes cells of columns 2 and 3, and so on. The numbering of words 304 and columns 306 is intended to represent words 304 and columns 306 in any region of the array 200 where data may be written. Thus, word 0 and column 0 are the first word 304 and column 306 for the depicted operations 300, which may be the first word 304 and column 306 for the array 200, but which may also be any other word 304 and column 306 for the array 200.

Additionally, in another embodiment, a word 304 may include cells of more or fewer than two columns 306. For example, in one embodiment, a column 306 may include sixteen bit lines, and a sixteen-bit word 304 may include cells of one column 306. In another embodiment, a sixty-four-bit word 304 may include cells of four eight-bit columns 306. Various other possible configurations of words 304 and columns 306 will be clear.

In the depicted embodiment, the operations 300 include a write operation, represented by arrows pointing from write data 302 to words 304 of the array 200, and a read operation, represented by arrows pointing from stored data 308 to read data 310. The operations 300 are performed by a die controller 206 for writing data to memory cells of an array 200 and reading data from the array 200. Write data 302 is received by the die controller 206 for writing to the array 200. Stored data 308 is the data as actually stored on the array 200. Read data 310 is read by the die controller 206 from the array 200. The write data 302, the stored data 308, and the read data 310 may be non-identical due to column skipping, and/or due to skip inconsistencies, as described below.

Write data 302, stored data 308, and read data 310 are depicted as bytes of data, representing characters of text (e.g., "It was the best of times . . . "). Spaces in the text are shown as horizontal dashes rather than as blank spaces, indicating that data is not missing from the write data 302, stored data 308, and read data 310 where a dash is depicted. Rather, where a dash is depicted, a byte representing a space character is present in the write data 302, stored data 308, and/or read data 310. Data values that do not correspond to text characters are depicted as hexadecimal numbers (e.g., hexadecimal values FFh are depicted in the stored data 308). Although the data 302, 308, 310 is depicted as the text of a well-known sentence for convenience in showing how errors or column skip inconsistencies affect the data 302, 308, 310, write and read operations 300 in various embodiments may write and various types of data to and from the array 200, such as text data, binary data, data of a file or object, audio or video data, or the like.

In the depicted embodiment, the die controller 206 receives write data 302 to write to the array 200. The skip component 150 skips words 304 of the array 200 when writing the received write data 302, based on a record of faulty columns 306. For example, in the depicted embodiment, column 4 is faulty, as indicated by the "XX" marking for column 4. Word 2 contains columns 4 and 5, and the "XX" marking for word 2 indicates that that word 304 includes a faulty column 306. A list or other record of bad words 304 or bad columns 306 may identify word 2 or column 4 as faulty). Thus, the skip component 150 skips word 2 when writing the data 302. For example, where the write data 302 is "It was the best of times . . ." as shown, "I" and "t" are written to columns 0 and 1, in word 0, a space and "w" are written to columns 2 and 3, in word 1, then columns 4 and 5 in word 2 are skipped, so that "a" and "s" are written to columns 6 and 7, in word 3.

In the depicted embodiment, the skip component 150 skips a word 304, which includes two columns 306. In another embodiment, a skip component 150 may skip a memory unit of another size, which may include one or more columns 306. For example, a skip component 150 may skip a single column 306, a set of four columns 306, a set of six columns 306, or the like. In another embodiment a skip component 150 may skip a memory unit that is not based on columns 306, such as a row or a set of rows.

Using a skip component 150 to skip words 304, columns 306 or other units when writing data shifts the data that follows the skipped word 304, column 306 or unit. Thus, in the depicted embodiment, the first two words of the write data 302 ("It w") are written to the first two depicted words 304 of the array 200, but after skipping the next word 304 of the array 200, the following data ("as the best of times . . .") is shifted one word back (e.g., away from the first depicted word 304) in the stored data 308. Thus, the stored data 308 includes unshifted bytes ("It w") from the beginning of the write data 302, bytes ("FFh FFh") of the skipped word 304, and shifted bytes ("as the best of times . . .") from later in the write data 302.

In the depicted embodiment, the bad column 306 may not be capable of reliably storing data, but is represented as storing a byte, in the stored data 308, in which all the bits are ones, corresponding to a hexadecimal value of "FFh." An all-ones or FFh byte may correspond to an erased state in some embodiments, where cells may be erased to a "1" value prior to programming to a "0" value. Attempting to read data from a bad column 306 may result in reading an FFh or all-ones byte if the column 306 is erased and accurately read without some bad cell or bit line returning a zero, or if a defect such as a short between bit lines causes ones to be read from the cells regardless of whether cells were erased or programmed. However, although the skipped columns 306 are depicted as storing FFh bytes, attempting to read data from those columns 306 may or may not result in actually reading FFh bytes, due to the faults or defects that led to skipping those columns 306 in the first place.

The skip component 150, in certain embodiments, may use spare or redundant units, words 304 or columns 306 (not shown) to store a portion of the write data 302 after skipping a faulty unit, word 304 or column 306. For example, if the write data 302 includes 512 bytes, and the skip component 150 skips a two-byte word 304 in a 512-byte region, then the stored data 308 may include unshifted bytes, two extra bytes for the skipped word 304, and shifted bytes, as described above, plus two more bytes (e.g., the last two bytes of the 512-byte write data 302) stored in a spare area or redundant word 304.

In the depicted embodiment, in certain embodiments, the die controller 206 reads the stored data 308, using the skip component 150 to skip the same faulty words 304 or columns 306 that were skipped when writing. Thus, in FIG. 3, the read data 310 that the die controller 206 outputs (e.g., to a device controller 126) includes the unshifted bytes ("It w") read from the stored data 308, followed immediately by the bytes ("as the best of times . . .") that were shifted in the stored data 308, omitting the FFh bytes of the skipped word 304.

In various embodiments, using a skip component 150 to skip units, words 304 or columns 306 of a memory array 200 may prevent a bad unit, word 304 or column 306 from affecting the data. If the skip component 150 skips the same bad unit, word 304 or column 306 during both writing and reading, the bad unit, word 304 or column 306 may be effectively invisible to other components such as a device controller 126 that sends the write data 302 in a write operation and receives the read data 310 in a read operation. However, in certain embodiments, a skip inconsistency may occur if the skip component 150 skips a unit, word 304 or column 306 during writing but not during reading, or during reading but not during writing.

FIGS. 4 through 7 depict various embodiments of skip inconsistencies for operations 400, 500, 600, 700, (respectively) which may be similar to the read and write operations 300 described above for FIG. 3. The write data 302, words 304, and columns 306 (including faulty column 4, affecting word 2) are as described above for FIG. 3. However, in FIGS. 4 through 6, a skip inconsistency occurs based on the skip component 150 skipping a word 304 with a bad column 306 during a write operation but failing to skip the same word 304 during a read operation. Conversely, in FIG. 7, a skip inconsistency occurs based on the skip component 150 failing to skip a word 304 with a bad column 306 during a write operation but skipping the word 304 during a read operation.

Figure 4:
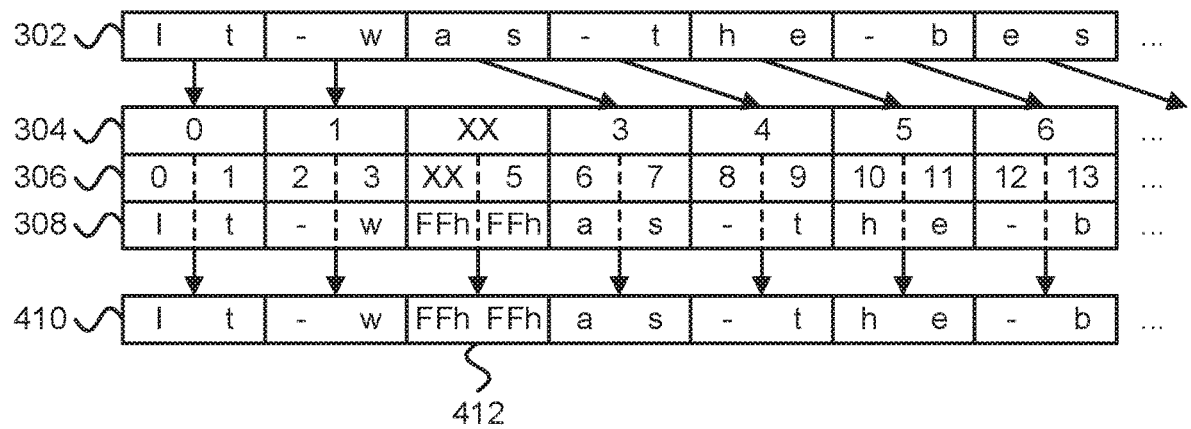
FIG. 4 is a schematic block diagram illustrating operations with one embodiment of a skip inconsistency.
Figure 5:
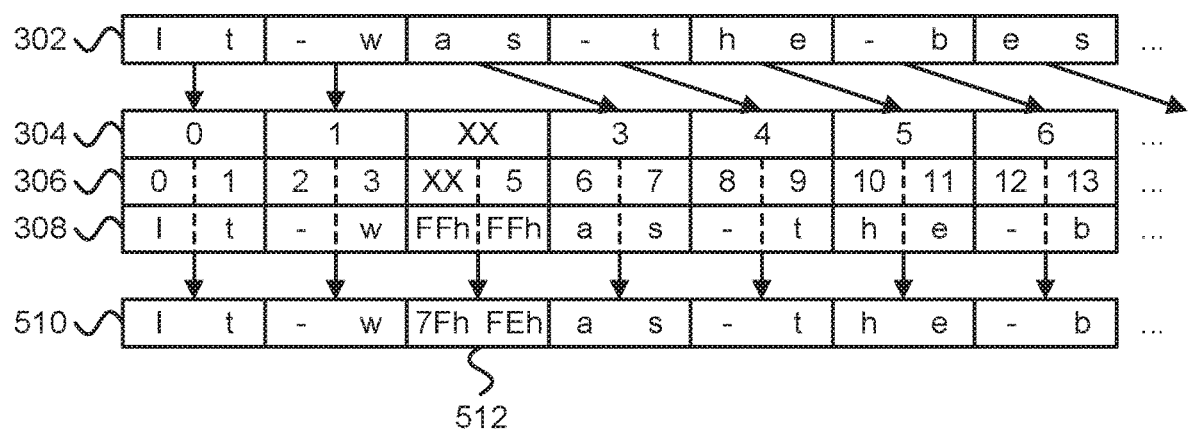
FIG. 5 is a schematic block diagram illustrating operations with another embodiment of a skip inconsistency.

In FIGS. 4 and 5, the skip component 150 skips word 2, containing bad column 4, when the die controller 206 writes the received data 302. Thus, as in FIG. 3, the stored data 308 includes all-ones or FFh bytes in word 2. However, the skip component 150 fails to skip word 2 when the die controller 206 reads the stored data 308. Thus, unlike in FIG. 3 where the read data 310 matches the write data 302, the read data 410, 510 in FIGS. 4 and 5 (respectively) includes a skip inconsistency in the form of a superfluous data value 412, 512 from the word 304 that was skipped in the write operation but unskipped in the read operation.

In FIG. 4, the superfluous data value 412 matches a pattern that is expected for bad columns 306 or words 304. In the depicted embodiment, attempting to read a bad column 306 or word 304, or a column 306 or word 304 that was skipped during writing, may predictably return a pattern of all ones, or one or more FFh bytes, for reasons described above. Thus, the superfluous data value 412 in FIG. 4 is a word of FFh bytes, or of all ones. In another embodiment, attempting to read a bad or skipped column 306 or word 304 may return a predictable data value or pattern other than all ones, such as all zeros, or another pattern. In some embodiments, a skip component 150 may be configured to detect a skip inconsistency in the form of a superfluous data value 412 by determining whether read data 410 includes a data value matching a predefined pattern, such as a pattern of all ones, a pattern of all zeros, or the like.

In FIG. 5, although the skipped columns 306 are depicted as storing FFh bytes, attempting to read data from those columns 306 does not result in actually reading FFh bytes. For example, due to the faults or defects that led to the skip component 150 skipping those columns 306 in the first place, one or both of the skipped columns 306 may have been erased to an all-ones state but attempting to read data from those columns 306 may result in reading a data value that includes mostly ones, with some zeros. Thus, in the depicted embodiment, the superfluous data value 512 includes bytes with hexadecimal values 7Fh and FEh, both of which include seven ones and one zero. In some embodiments, a skip component 150 may be configured to detect a skip inconsistency in the form of a superfluous data value 512 by determining whether read data 510 includes a data value within a threshold of deviation from a predefined pattern, such as a pattern of all ones, a pattern of all zeros, or the like. A threshold of deviation may define a measurement or indication of how much a data value may differ from the predefined pattern and still be interpreted as matching the predefined pattern. For example, in one embodiment, a skip component 150 may use a two-bit threshold of deviation for determining whether a sixteen-bit data value matches an all-ones pattern and may determine that the superfluous data value 512 is within the two-bit threshold of deviation, because it includes fourteen ones and two zeros.

Figure 6:
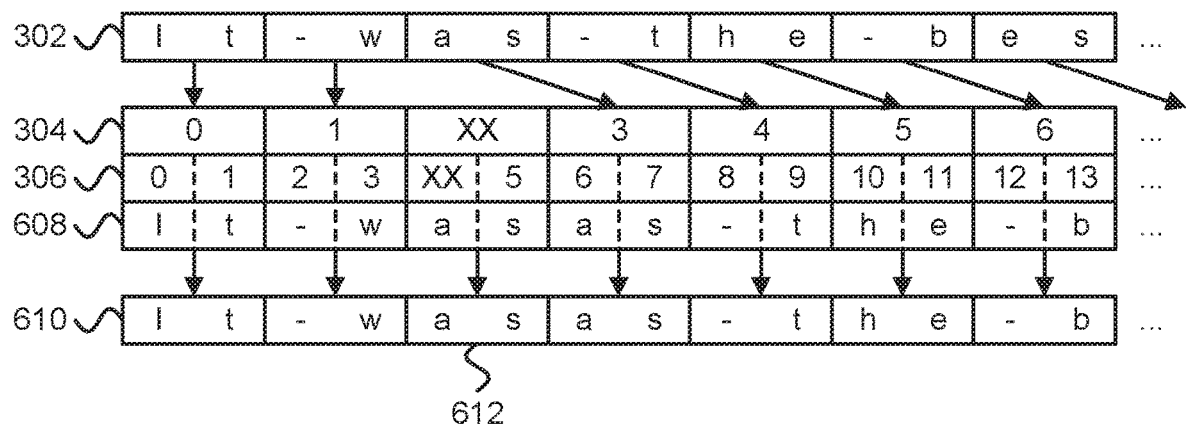
FIG. 6 is a schematic block diagram illustrating operations with another embodiment of a skip inconsistency.

In FIG. 6, the skip component 150 skips word 2, containing bad column 4, when the die controller 206 writes the received write data 302, but fails to skip word 2 when the die controller 206 reads the stored data 608. However, unlike in FIGS. 4 and 5, the stored data 608 does not include all-ones or FFh bytes in word 2. In some embodiments, data of a bad or skipped column 306 or word 304, as stored and/or as read, may include a duplicated data value from a nearby column 306 or word 304. For example, in the depicted embodiment, the skipped word 304 may include a defect making it susceptible to write disturbs and writing the bytes "a" and "s" to the next word 304 (word 3) may also result in the same bytes "a" and "s" being stored in or read from word 2. Thus, in FIG. 6, the stored data 608 and the read data 610 include duplicated "a" and "s" bytes in words 2 and 3. The read data 610 thus includes a skip inconsistency in the form of a superfluous data value 612 from the word 304 that was skipped in the write operation but unskipped in a read operation, but the superfluous data value 612 is a duplicated data value rather than a data value that matches, or is within a threshold of deviation from, a predefined pattern.

In certain embodiments, a skip component 150 may be configured to detect a skip inconsistency in the form of a superfluous data value 612 by determining whether read data 610 includes a duplicated data value. In some embodiments, duplication of a data value by a bad column 306 or word 304 may be predictable based on the hardware design of a memory array 200. For example, in one embodiment, bad columns 306 of an array 200 may consistently or predictably duplicate data from adjacent columns 306 to the right. In another embodiment, bad columns 306 of an array 200 may consistently or predictably duplicate data from adjacent columns 306 to the left. In another embodiment, bad columns 306 of an array 200 may consistently or predictably duplicate data from two columns 306 away. In various embodiments, a skip component 150 may detect a skip inconsistency by determining whether read data 610 includes a duplicated data value within a predefined range, such as within a one-column radius, within a two-column radius, within two columns to the right, within two columns to the left, or the like.

In certain embodiments, a skip inconsistency in the form of a superfluous data value 612 in read data 610 may shift a portion of the read data 610 backward (e.g., away from the beginning of the read data 610). For example, in FIG. 6, every word of the read data 610 following the superfluous data value 612 is shifted out of position. Such a shift may be uncorrectable using an error correcting code, due to the large number of errors caused by the shift. However, the skip component 150 may correct the skip inconsistency and output corrected data by removing the superfluous data value 612.

Figure 7:
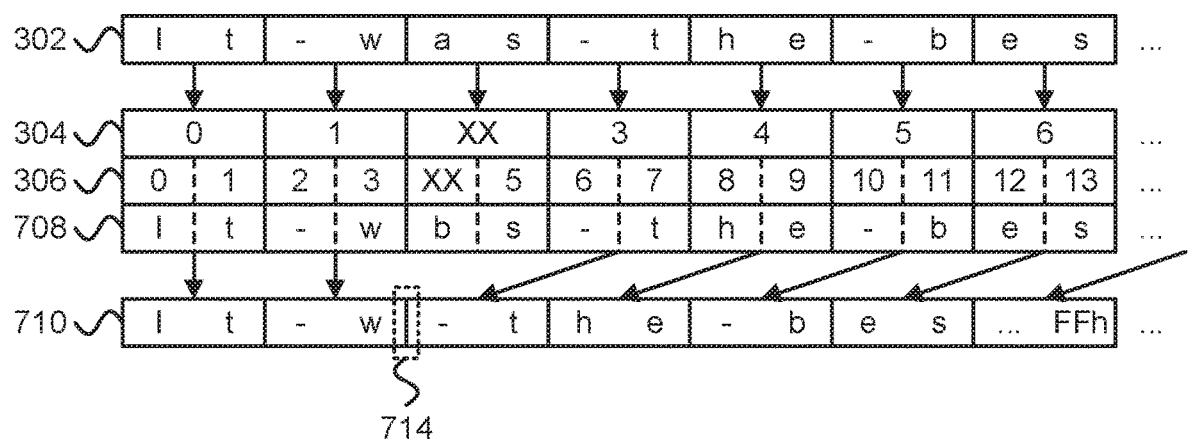
FIG. 7 is a schematic block diagram illustrating operations with another embodiment of a skip inconsistency.

In FIG. 7, the skip component 150 fails to skip word 2, containing bad column 4, when the die controller 206 writes the received write data 302. Thus, the stored data 708 matches the write data 302 without FFh or duplicated values as in FIGS. 3-6, except in column 4, where a defect has caused the stored data 708 to differ from the write data 302 received by the die controller 206. However, the skip component 150 does skip word 2 when the die controller 206 reads the stored data 708. Thus, in FIG. 7, the read data 710 includes a skip inconsistency in the form of a missing data value 714 (location indicated by dashed lines.)

In certain embodiments, a skip inconsistency in the form of a missing data value 714 in read data 710, may shift a portion of the read data 710 forward (e.g., toward from the beginning of the read data 710). For example, in FIG. 7, every word of the read data 710 following the missing data value 714 is shifted out of position. As when data is shifted backward following a superfluous data value 612, a forward shift following a missing data value 714 may be uncorrectable using an error correcting code, due to the large number of errors caused by the shift. In certain embodiments, a skip component 150 may detect a skip inconsistency by determining that read data 710 is uncorrectable, or by receiving an uncorrectable error correcting code (UECC) signal from another component that receives the read data 710, such as a device controller 126.

If data is uncorrectable but the skip component 150 does not detect a superfluous data value 612, then the skip component 150 may determine that a data value is missing from the read data 710 and may correct the skip inconsistency and output corrected data by re-reading the stored data 708 without skipping certain units, words 304, or columns 306. For example, in the depicted embodiment, with one word 304 marked for skipping, the skip component 150 may re-read the stored data 708 without skipping word 2. In another embodiment, with more than one unit, word 304, or column 306 marked for skipping, the skip component 150 may iteratively re-read the stored data with different columns 306 unskipped, until the read data 710 is correctable.

In another embodiment, a skip component 150 may infer the existence of a missing data value 714 by detecting bad data at the end of the read data 710. For example, in the depicted embodiment, data following the missing data value 714 is shifted forward, and the end of the read data 710 includes an erroneous all-ones or FFh byte. The skip component 150 may similarly correct the skip inconsistency and output corrected data by re-reading the stored data 708 without skipping certain units, words 304, or columns 306.

In certain embodiments, a skip component 150 may be referred to as correcting a skip inconsistency and outputting corrected read data 710 even if errors (such as single-column or correctable errors) still exist in the read data 710, if the skip inconsistency is removed so that the read data 710 is no longer shifted or misaligned. For example, in the depicted embodiment, re-reading the stored data 708 without skipping word two will still result in an error being present due to the defect in column 4 (e.g., storing a "b" instead of an "a"). However, an error in a single column 306 may be correctable using an error-correcting code.

Figure 8:
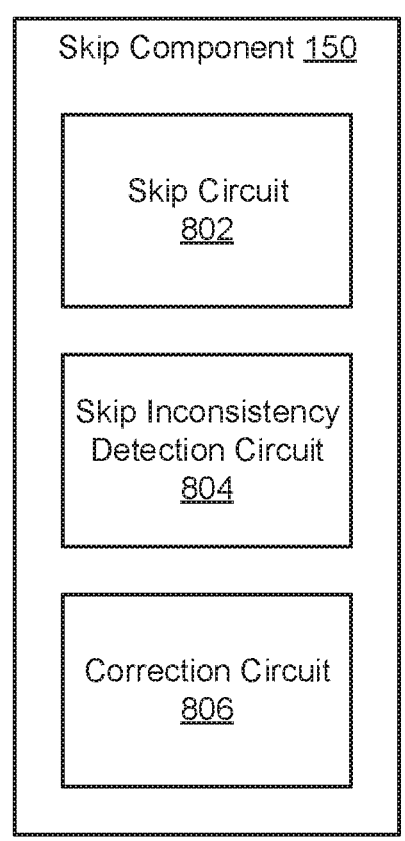
FIG. 8 is a schematic block diagram illustrating one embodiment of a skip component.

FIG. 8 depicts one embodiment of a skip component 150. In the depicted embodiment, the skip component 150 may be substantially similar to the skip component 150 described above with regard to FIGS. 1-7. In the depicted embodiment, the skip component 150 includes a skip circuit 802, a skip inconsistency detection circuit 804, and a correction circuit 806.

The skip circuit 802, in one embodiment, is configured to skip memory units for read operations and write operations of a memory array 200. Read and write operations may be performed by a die controller 206, as described above. A memory unit, in various embodiments, may be a group or set of memory cells that is treated as a unit for skipping and/or redundancy purposes so that the cells in the group can be skipped together, or replaced together by a spare or redundant group of equivalent size. For example, the skip circuit 802 may skip a memory unit such as a column, a set of one or more columns, a row, a set of one or more rows, a byte, a word, a page, or the like, during a read or wrote operation performed by the die controller 206. When the skip circuit 802 skips a memory unit during a write operation, the die controller 206 may write some of the data of the write operation to a redundant memory unit, such as a spare row, a spare column, or the like.

In certain embodiments, a die controller 206 may perform a read operation or a write operation by reading data from, or writing data to, a set of multiple memory units. The skip circuit 802, in various embodiments, may skip a memory unit by causing the die controller 206 to read or write data for the other memory units in the set, but not for the skipped memory unit. For example, if rows are numbered and the die controller 206 writes data to a set of rows including rows 23-26, the skip circuit 802 may skip row 25 by causing the die controller 206 to write to rows 23-24, 26, and a spare or redundant row, but not to row 25. As another example, if columns are numbered and the die controller reads data from a row that spans columns 1-10, the skip circuit 802 may skip column 7 by causing the die controller 206 to read data from cells in the row that are in columns 1-6, 8-10, and a spare or redundant column, but not from cells in the row that are in column 7. Various other or further ways for a skip circuit 802 to skip memory units will be clear.

In certain embodiments, a memory unit may have an address or identifier. In one embodiment, a memory unit may be externally addressable. For example, a read command may include an address of a memory unit to read data from. In another embodiment, a memory unit may be larger than, smaller than, or otherwise different from an externally addressable memory unit, but may have an address or identifier that the skip circuit 802 uses for skipping and/or redundancy purposes. For example, a write command may include an address of a row to write data to, but a skip circuit 802 may use column addresses to identify columns to skip.

The skip circuit 802, in some embodiments, skips memory units based on a record of memory units identified as faulty or bad. A bad or faulty memory unit may include any memory unit that is unsuitable for data storage for any reason. For example, a bad or faulty column (or other memory unit) may include defects from the manufacturing process such as a short between bit lines, that prevents data from being reliably stored and/or read in the column. Another bad or faulty column (or other memory unit) may no longer reliably store data due to wear. In various embodiments, memory units may be identified as faulty in a variety of ways. For example, in one embodiment, a manufacturer of a memory die may test the array 200 and determine which memory units are faulty. In another embodiment, a skip circuit 802 may identify faulty memory units on an on-going basis, based on data errors, long programming times for writing data, long erase times for erasing data, or the like.

A record of faulty memory units, in various embodiments, may include any physical structure or configuration of data that records which memory units have been identified as faulty. In one embodiment, a record of faulty memory units may include a data structure such as a list, a tree, an array, a lookup table or the like, that records addresses or locations of memory units identified as faulty. In certain embodiments, a skip circuit 802 may maintain or refer to a record of faulty memory units stored in register memory, in volatile memory of a die controller 206, in reserved non-volatile memory of the array 200, or the like. In one embodiment, the record of memory units identified as faulty may include a set of column address registers, which are registers recording column addresses of bad columns. The skip circuit 802 may include or be in communication with the bad column register(s), which are described in further detail below with regard to FIG. 9.

In another embodiment, a skip circuit 802 may include or be in communication with a record of faulty memory units in the form of a physical structure. For example, in one embodiment, a record of faulty memory units may include a set of fuses corresponding to columns, and the skip circuit 802 may skip a column by melting a fuse with a high electrical current to open an electrical circuit so that corresponding column is no longer accessible. Various other or further ways to record faulty memory units using data structures or physical structures will be clear.

In certain embodiments, the skip circuit 802 may skip faulty columns of a memory array 200 in read operations and write operations performed by the die controller 206 for the memory array 200. For example, in one embodiment, the die controller 206 may write data in to memory cells of the array 200, and the skip circuit 802 may shift the data stored in the array 200, or a portion of the data, to avoid bad columns of the array 200. Shifting the data may include writing data to columns or memory units that are offset from where the data would normally be written in the absence of bad columns or memory units. For example, the skip circuit 802 may shift data stored in or written to the array 200, by writing a first portion of the data to columns, skipping a bad column, and writing the remaining data to columns that are offset from where the data would normally be written, to compensate for the bad column.

The skip inconsistency detection circuit 804, in one embodiment, is configured to detect a skip inconsistency in read data. Read data, in various embodiments, may be data of a read operation, such as data that the die controller 206 reads from the memory array 200. Due to the skip circuit 802 skipping faulty columns or memory units during read operations, read data from a read operation may include data from columns or memory units that were unskipped during the read operation, but not from columns or memory units that were skipped during the read operation.

A skip inconsistency, in various embodiments, may be any error in the read data caused by the skip circuit 802 erroneously skipping or failing to skip a column or other memory unit when the die controller 206 reads or writes data from the array 200. A column skip inconsistency, specifically, may be a skip inconsistency caused by the skip circuit 802 erroneously skipping or failing to skip a column. Some examples of skip inconsistencies, including superfluous and/ or missing data values, are described above with reference to FIGS. 4-7.

In certain embodiments, the skip circuit 802 may erroneously skip or fail to skip a column, thus causing a skip inconsistency in the read data, due to defects or circuit marginality issues in the skip circuit 802, errors in a record of bad columns, or the like. In some embodiments, the skip circuit 802 may load a record of bad columns from storage during power-on initialization, but may incorrectly load or register a column address, causing a skip inconsistency. In another embodiment, a column address in a record of bad columns may transition over time. For example, if one or more bits in a data structure that records which columns are good or bad are flipped due to charge leakage (or any other error-causing phenomenon), then a bad column that is skipped by the skip circuit 802 when the die controller 206 writes data may be considered good and may not be skipped when the die controller 206 reads data.

In one embodiment, a skip inconsistency may include a superfluous data value from a memory unit skipped by the skip circuit 802 in a write operation and unskipped by the skip circuit 802 in a read operation. In certain embodiments, the skip inconsistency detection circuit 804 may detect a superfluous data value in data read from the memory array 200. The superfluous data value may indicate that a column avoided by the skip circuit 802 when writing the data was unskipped by the skip circuit 802 when the data was read. For example, when the die controller 206 writes data to the array 200, the skip circuit 802 may skip a bad column, shifting the data to avoid the skipped column. However, if the skip circuit 802 erroneously leaves the bad column unskipped when the die controller 206 reads the data, then the data will include a superfluous value read from the unskipped bad column. Similarly, if the skip circuit 802 erroneously skips a good column during a write operation, shifting the data, but reads from that column during a read operation (assuming that a similar error does not cause the skip circuit 802 to skip the same column again), then the data will include a superfluous value read from the good column that was skipped at write time but not at read time.

If a good column was erroneously skipped by the skip circuit 802 during a write operation but unskipped during a read operation, a superfluous data value from the good column may be whatever data was previously in the good column. For example, a superfluous data value from a good column that was skipped during write but unskipped during read may be an all-ones or FFh data value corresponding to an erased state or may be data that was previously stored in the column. If a bad column was skipped by the skip circuit 802 during a write operation but erroneously unskipped during a read operation, a superfluous data value from the bad column may be data that was previously in the bad column or may be another data value caused by a defect. For example, a data value from a bad column may match a predefined pattern such as an all-ones or FFh pattern, may be within a threshold of deviation from a predefined pattern, or may be a duplicated data value from another column. Some examples of superfluous data values are described above with reference to FIGS. 4-6.

In certain embodiments, a portion of the read data following a superfluous data value may be shifted backward. In some embodiments, data may be in an ordered sequence. For example, in one embodiment, data values may be transmitted one after another, on an input/output bus. In another embodiment, data values may be transmitted simultaneously but may still be in an order. For example, if 4 bytes are transmitted simultaneously over a 64-bit bus, the bytes may include a first byte, a second byte, and so on. Shifting a data value backward, in various embodiments, may include changing the position of the data value to be further from the beginning of an ordered sequence of data values. Conversely, shifting a data value forward, in various embodiments, may include changing the position of the data value to be closer to the beginning of an ordered sequence of data values.

For example, if the skip circuit 802 skips the third column when writing data to columns, but erroneously leaves the third column unskipped when reading data, then data values from the first two columns will be unshifted, a superfluous data value from the third column will appear in the read data, and data following the superfluous data value will be shifted backward. Data from the fourth column, the fifth column, and so on, would normally be the third data value, the fourth data value, and so on, due to skipping of the third column, but will now be the fourth data value, the fifth data value, and so on, due to the skip circuit 802 failing to skip the third column.

In some embodiments, a skip inconsistency may be a missing data value from a memory unit unskipped by the skip circuit 802 in a write operation, but unskipped by the skip circuit 802 in a read operation. In certain embodiments, the skip inconsistency detection circuit 804 may detect a missing data value in data read from the memory array 200. The missing data value may indicate that a column avoided by the skip circuit 802 when reading the data was unskipped by the skip circuit 802 when the data was written. For example, when the die controller 206 writes data to the array 200, the skip circuit 802 may leave a good column unskipped but may erroneously skip that column when the die controller 206 reads the data, resulting in data from that column being missing from the read data. Similarly, if the skip circuit 802 erroneously leaves a bad column unskipped during a write operation, but skips the bad column during a read operation, then the data value written to the bad column will be missing from the read data. An example of a missing data value is described above with regard to FIG. 7.

In certain embodiments, a portion of the read data following a missing data value may be shifted forward. For example, if the skip circuit 802 leaves the third column unskipped when writing data, but skips the third column during a read operation, then data value from the first two columns will be unshifted, a data value from the third column will be missing from the read data, and data following the missing data value will be shifted forward. Data from the fourth column, the fifth column, and so on, would normally be the fourth data value, the fifth data value, and so on, with no column skipping, but will now be the third data value, the fourth data value, and so on, due to the skip circuit 802 skipping the third column.

In one embodiment, if the skip circuit 802 leaves a good column unskipped when writing data, but erroneously skips the column during a read operation, a missing data value may be recoverable by reading data from the skipped column. In another embodiment, if the skip circuit 802 erroneously leaves a bad column unskipped when writing data, but skips the column during a read operation, the missing data value may not be recoverable due to being written to a bad or unreliable column. However, inserting even an erroneous data value into the read data in place of a missing data value may correct the forward shift described above. Ways to correct a skip inconsistency that includes a superfluous data value or a missing data value are described below with reference to the correction circuit 806.

The skip inconsistency detection circuit 804, in one embodiment, may detect a skip inconsistency by determining that the read data includes a data value matching a predefined pattern, a data value within a threshold of deviation from a predefined pattern, and/or duplicated data values within a predefined range. For example, the skip inconsistency detection circuit 804 may detect a superfluous data value by comparing data values in the data read from the array 200 to a predefined pattern, and to other data values in the data read from the array 200, such as adjacent data values or other data values within a predefined range. Similarly, the skip inconsistency detection circuit 804 may detect a missing data value by comparing the end of the read data to a predefined pattern.

In one embodiment, a superfluous data value in a skip inconsistency may match a pre-defined pattern. Extra data at the end of read data, due to a missing data value in the read data, may also match a pre-defined pattern. A pattern may be a known or pre-defined data value and may be defined by a manufacturer of a memory die, a manufacturer of a memory device, or the like. For example, in one embodiment, a pre-defined pattern may be, or may include an all-ones or FFh byte, an all-zeros or 00h bytes, or the like. In certain embodiments, a predefined pattern may be a known output for bad columns or other memory units. For example, in one embodiment, shorts between bit lines may cause a column to output ones, regardless of what data value was stored.

In some embodiments, data may be transformed prior to storage (e.g., by the die controller 206, the device controller 126, a device driver, or the like), in a way that avoids certain patterns. For example, in one embodiment, data may be compressed, scrambled, or "whitened" to avoid storing long sequences of zeroes or ones. Thus, in certain embodiments, the skip inconsistency detection circuit 804 may detect a skip inconsistency by determining that a data value matches a pattern of all zeros, all ones, or the like. In another embodiment, the skip inconsistency detection circuit 804 may detect a skip inconsistency by determining that a data value matches a pattern other than a pattern of all zeros or all ones. Various other or further types of patterns will be clear. The skip inconsistency detection circuit 804 may include a register, memory, or other storage where a predefined pattern is stored, and/or may include comparison hardware, such as a set of logic gates, to detect a data value matching the predefined pattern.

In a further embodiment, the skip inconsistency detection circuit 804 may detect a skip inconsistency by determining that the read data includes a data value within a threshold of deviation from a predefined pattern. A data value that is not an exact match for a predefined pattern may be within a threshold of deviation from the predefined pattern if it is a sufficiently close match for the predefined pattern, and the threshold of deviation may be a definition of a sufficiently close match. In one embodiment, a threshold of deviation may be a definition how many bits may differ (e.g., a Hamming distance) between a data value and a predefined pattern. For example, when comparing an 8-bit data value to an all-ones or FFh pattern with a two-bit threshold of deviation, the data value may be within the threshold of deviation from the defined pattern if it includes 6, 7, or 8 ones. Various other or further types of thresholds of deviation will be clear. The skip inconsistency detection circuit 804 may include hardware to determine whether a data value within a threshold of deviation from a predefined pattern. For example, in one embodiment, the skip inconsistency detection circuit 804 may include summing hardware that adds outputs of logic gates that compare bits, to determine if the sum satisfies a threshold.

In a further embodiment, the skip inconsistency detection circuit 804 may detect a skip inconsistency by determining that the read data includes duplicated data values within a predefined range. In some embodiments, as described above with reference to FIG. 6, attempting to read data from a bad column or bad memory unit may result in duplicating nearby data, such as data of the next column or memory unit, data from two columns or memory units over, or the like. In some embodiments, data compression, or scrambling (e.g., by the die controller 206, the device controller 126, a device driver, or the like prior to writing) may avoid or compress duplicated data values that are close together. Thus, in certain embodiments, the skip inconsistency detection circuit 804 may detect a skip inconsistency by determining that the read data includes duplicated data values within a predefined range.

A range for detecting duplicated data values may be defined by a manufacturer of a memory die, a manufacturer of a memory device, or the like. For example, the skip inconsistency detection circuit 804 may be configured to detect duplicated data values one column apart, two columns apart, within a range of up to four columns apart, or the like. Various other or further ranges for detecting duplicate data values will be clear. The skip inconsistency detection circuit 804 may include comparison hardware to detect duplicate data values, such as a set of logic gates comparing data in adjacent stages of an output queue for a memory die, a set of logic gates comparing data two stages apart in an output queue, or the like.

In one embodiment, the skip inconsistency detection circuit 804 may detect a skip inconsistency by determining that the read data is uncorrectable. In certain embodiments, data may be encoded with an error-correcting code prior to writing (e.g., by the die controller 206, the device controller 126, a device driver, or the like prior to writing.) If errors arise during data retention, or when the data is read, an error-correcting code decoder may be able to detect and/or correct a limited number of errors. Data may be referred to as "uncorrectable" if an error-correcting code decoder is unable to correct the errors. In certain embodiments, data that is uncorrectable by one error-correcting code decoder may be correctable using another error-correcting code decoder. For example, data that is uncorrectable using a hard-decision decoder that processes binary data values may be correctable using a soft-decision decoder that processes likelihood information indicating which bits are likely to be in error. However, data that is correctable at some level may be referred to as uncorrectable if it is uncorrectable by at least one decoder.

In some embodiments, data may be uncorrectable if a portion of the data is shifted backward following a superfluous data value or shifted forward following a missing data value. Thus, in certain embodiments, the skip inconsistency detection circuit 804 may detect an inconsistency by determining that read data is uncorrectable. For example, the skip inconsistency detection circuit 804 may include an error-correcting code decoder or may be in communication with error-correcting code decoder and may determine that a skip inconsistency exists in response to the error-correcting code decoder determining that the data is uncorrectable.

In a certain embodiment, a device controller 126 may include an error-correcting code decoder. The device controller 126 may receive data read from the array 200, including any skip inconsistencies such as superfluous and/or missing data values. If no skip inconsistency is present, the device controller 126 may successfully decode the data. If a skip inconsistency is present, the device controller 126 may determine that the data is not correctable and may send an uncorrectable error correcting code (UECC) signal to the die controller 206. In a further embodiment, the skip inconsistency detection circuit 804 for the die controller 206 may determine that the read data is uncorrectable, and thus detect a skip inconsistency, by receiving a UECC signal from the device controller 126. The correction circuit 806 may then correct the skip inconsistency and re-output corrected data to the device controller 126, as described below. However, in another embodiment, the skip inconsistency detection circuit 804 may detect a skip inconsistency before data is output to the device controller 126, and the correction circuit 806 may correct the skip inconsistency and output corrected data without first outputting non-corrected data.

The correction circuit 806, in one embodiment, is configured to correct a skip inconsistency detected by the skip inconsistency detection circuit 804, and to output corrected read data. In various embodiments, the correction circuit 806 may correct a skip inconsistency by removing the skip inconsistency from data. For example, where the skip inconsistency includes a superfluous data value, the correction circuit 806 may correct the skip inconsistency by removing the superfluous data value and may output corrected read data with the superfluous data value removed. As another example, if the skip inconsistency includes a missing data value, the correction circuit 806 may correct the skip inconsistency by communicating with the skip circuit 802 to retry the read operation with one or more columns unskipped, so as to output corrected data with the missing data value restored.

In further embodiments, the correction circuit 806 may output corrected data. Correcting a skip inconsistency and outputting corrected data, in certain embodiments, may refer to outputting data with the skip inconsistency removed. The corrected data may still include errors other than the skip inconsistency (e.g., erroneous bits that may be correctable by an error-correcting code decoder) but may still be referred to as "corrected" data if the correction circuit 806 has removed the skip inconsistency.

In one embodiment, the skip inconsistency detection circuit 804 may detect a skip inconsistency while the read data is in an output data path for a memory die. For example, in certain embodiments, an output data path for a memory die may include an output queue, an asynchronous queue to compensate between different internal and external bus speeds, a serializer to convert data from an internal bus width to a narrower external bus width, or the like, and the skip inconsistency detection circuit 804 may detect a skip inconsistency by comparing data values in one stage of the output queue to a predefined pattern, or to a data value in a subsequent stage of the output queue, or the like.

In a further embodiment, a correction circuit 806 may correct a skip inconsistency in the output data path. In one embodiment, the correction circuit 806 may correct a skip inconsistency by removing a superfluous data value detected by the skip inconsistency detection circuit 804 from the read data. For example, if the skip inconsistency detection circuit 804 detects a superfluous data value in the output queue, the correction circuit 806 may correct the skip inconsistency and output corrected data by skipping over the superfluous data value as data is output from the queue (e.g., by moving an output pointer two stages forward to skip a value in the queue).

In another embodiment, a correction circuit 806 may correct a skip inconsistency other than by modifying data in the output data path. For example, the correction circuit 806 may remove a superfluous data value in the data path so that corrected data is output from the die to the device controller 126, or may output non-corrected data to the device controller 126, then correct the skip inconsistency by retrying the read operation so that the skip circuit 802 skips the column that produced the superfluous data value (e.g., the correction circuit 806 may update a register of bad column addresses may be updated).

In one embodiment, the correction circuit 806 may add or remove a memory unit address or column address to the list or record of memory units identified as faulty, which the skip circuit 802 uses to skip memory units. In a further embodiment, the correction circuit 806 may output corrected read data by retrying a read operation. For example, the correction circuit 806 may add the address of a bad column to a register of bad columns in response to the skip inconsistency detection circuit 804 detecting a superfluous data value and may retry a read operation with the skip circuit 802 skipping the bad column based on the updated register of bad columns. As another example, the correction circuit 806 may remove a column address from a register of bad columns in response to the skip inconsistency detection circuit 804 detecting a missing data value and may retry a read operation with the skip circuit 802 leaving a column unskipped based on the updated register of bad columns.

In one embodiment, the correction circuit 806 may add or remove a memory unit address or column address to the list or record of memory units identified as faulty, for long-term use. For example, if a memory unit is bad, the correction circuit 806 may mark it as bad for future read and write operations. In another embodiment, the correction circuit 806 may temporarily add or remove a memory unit address or column address to the list or record of memory units identified as faulty. For example, the correction circuit 806 may temporarily cause the skip circuit 802 to skip (or leave unskipped) a memory unit to correct a skip inconsistency, without making a long-term change to the record of memory units identified as faulty.

In various embodiments, the correction circuit 806 may add or remove a memory unit address or column address to the list or record of memory units identified as faulty in conjunction with correcting a skip inconsistency in the output data path, or may add or remove a memory unit address or column address to the list or record of memory units identified as faulty prior to retrying a read operation to output corrected data. In certain embodiments, the correction circuit 806 outputs the corrected read data by retrying a read operation in response to an uncorrectable error in the read data. For example, the skip inconsistency detection circuit 804 may detect an uncorrectable error or may receive a UECC signal from a device controller 126 that receives non-corrected data, and the correction circuit 806 may retry a read operation in response to the uncorrectable error.

In one embodiment, the skip inconsistency may have been the result of a transient error in the skip circuit 802 during a read operation (e.g., erroneously skipping a good column, or leaving a bad column unskipped), and the correction circuit 806 may correct the skip inconsistency simply by retrying the read, if the transient error does not occur a second time. In another embodiment, the skip inconsistency may be the result of a transient error in the skip circuit 802 during a write operation (e.g., erroneously skipping a good column, or leaving a bad column unskipped), and the correction circuit 806 may correct the skip inconsistency by retrying the read with one or more memory unit addresses temporarily added to, or removed from, the record of memory units identified as faulty, so that the skip circuit 802 during the read operation skips (or leaves unskipped) the same memory units that it erroneously skipped (or left unskipped) during the write operation. In another embodiment, the skip inconsistency may be the result of a persistent error for the skip circuit 802 that arose between reading and writing data, such as a bit inadvertently flipping in a bad column register so that a good column is persistently marked as bad and/or a bad column is persistently marked as good, and the correction circuit 806 may correct the skip inconsistency by retrying the read with one or more memory unit addresses added to, or removed from, the record of memory units identified as faulty on a long-term basis.

In certain embodiments, the skip inconsistency detection circuit 804 may detect a plurality of skip inconsistencies in data of a read operation, and the correction circuit 806 may correct the plurality of skip inconsistencies. For example, in one embodiment, the skip inconsistency detection circuit 804 may detect multiple superfluous data values, and the correction circuit 806 may remove the superfluous data values to output corrected data. As another example, multiple data values may be missing from the read data, and the skip inconsistency detection circuit 804 and the correction circuit 806 may cooperate to iteratively determine that at least one data value is missing (e.g., based on uncorrectable data, or on bad data at the end of the read data), and re-read with skipping turned off for one or more columns, until the data is correctable.

Figure 9:
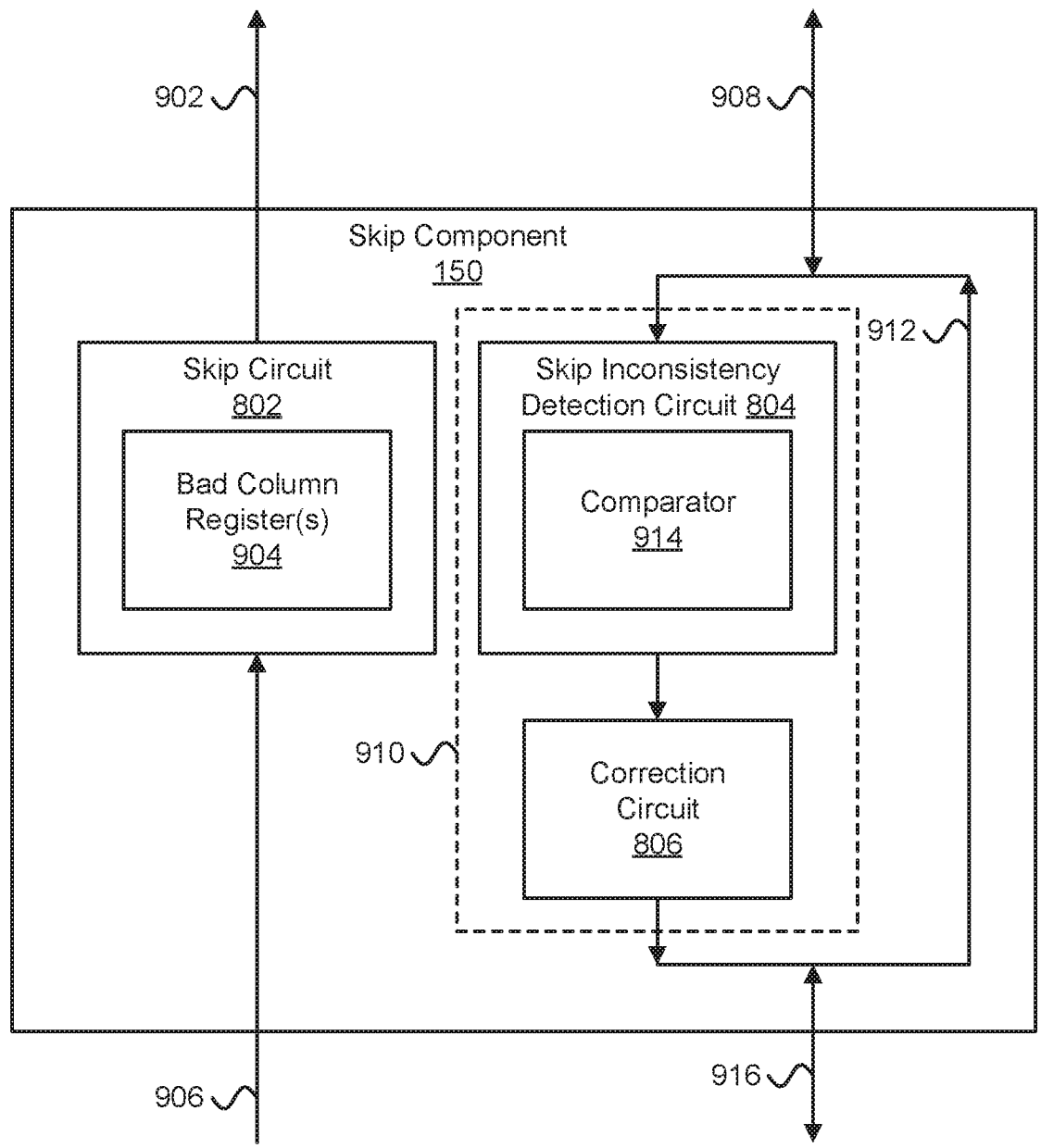
FIG. 9 is a schematic block diagram illustrating another embodiment of a skip component.

FIG. 9 depicts another embodiment of a skip component 150. In the depicted embodiment, the skip component 150 may be substantially similar to the skip component 150 described above with regard to FIGS. 1-8. In the depicted embodiment, the skip component 150 includes a skip circuit 802, a skip inconsistency detection circuit 804, and a correction circuit 806, which may be substantially as described above with regard to FIG. 8. In the depicted embodiment, the skip circuit 802 includes one or more bad column registers 904, and the skip inconsistency detection circuit 804 includes a comparator 914.

The one or more bad column registers 904, in various embodiments, may be a set of registers that record addresses or other identifiers for columns that are bad or that are identified as faulty. In one embodiment, a skip circuit 802 may include a first set of column address registers 904 for recording addresses of known bad columns and may include one or more additional sets of column address registers 904 for temporarily turning skipping on or off for columns (e.g., to re-read data with skip inconsistencies corrected). In another embodiment, a skip circuit 802 may use a single set of column address registers 904 for column skipping.

In the depicted embodiment, the skip component 150 receives command and address information (e.g., from a device controller 126) via a command/address bus 906, and sends and receives data (e.g., to or from a device controller 126) via a data bus 916. The skip component 150 communicates with the memory array 200, via row circuits 202 and column circuits 204, using an internal address command/ address bus 902 and an internal data bus 908. Command and address buses 902, 906 and data buses 908, 916 are depicted separately to illustrate the flow of information, but, in various embodiments, may be separate buses or may be unified buses that carry commands, addresses, and data.

The skip component 150, in the depicted embodiment, includes a write data path 912 for data to be written to the array 200, and a read data path 910 for data read from the array 200. In the depicted embodiment, the skip inconsistency detection circuit 804 and the correction circuit 806 are disposed in the read data path 910 to detect inconsistencies in the read data, and output corrected read data.

For a read operation or a write operation, the skip circuit 802 receives a command and an address via the external command/address bus 906. The skip circuit 802 may, in certain embodiments, decode the external address to determine row and/or column addresses, and may communicate the row and/or column addresses to the row circuits 202 and/or the column circuits 204, via the internal command/ address bus 902. In one embodiment the skip circuit 802 may skip columns based on the bad column register(s) 904 by outputting translated column addresses on the internal command/address bus 902. For example, if column number four is bad, the skip circuit 802 may translate column address 4 to column address 5, translate column address 5 to column address 6, and so on, so that the read operation or the write operation is performed at shifted column addresses. In certain embodiments, the skip circuit 802 may skip columns based on the bad column registers 904 by modifying data in the read data path 910 or the write data path 912. For example, the skip circuit 802 may skip a column during a read operation by removing a data value from the read data path 910 or may skip a column during a write operation by adding a data value (e.g., FFh or all-ones) to data in the write data path 912. In one embodiment, the skip circuit 802 may skip columns using a combination of address translation and data modification.

The skip inconsistency detection circuit 804, may detect skip inconsistencies in data read from the array 200. In the depicted embodiment, the skip inconsistency detection circuit 804 includes a comparator 914. A comparator 914, in certain embodiments, may be an array of logic gates such as AND gates, NAND gates, or the like, that compare bits of the read data to a predefined pattern, and/or to other bits of read data. For example, in one embodiment, a set of AND gates may be coupled across two adjacent stages of an output queue as inputs to detect whether adjacent data values are duplicated. In another embodiment, a tree of AND gates may be coupled to bits in one stage of an output queue so that the tree of AND gates outputs a single "1" if all the bits if a data value are ones. Various other or further ways to use logic gates or other comparison hardware in a comparator 914, to compare data values to predefined patterns or to other data values, will be clear in view of this disclosure.

The correction circuit 806, in the depicted embodiment, may correct skip inconsistencies detected by the skip inconsistency detection circuit 804, and may output corrected data. In one embodiment, the correction circuit 806 may output corrected data by modifying data in the read data path 910, prior to outputting data. In certain embodiments, correcting a skip inconsistency by modifying data in the read data path 910, prior to outputting data, may save time that might otherwise be spent attempting to correct uncorrectable data.

In another embodiment, the correction circuit 806 may output corrected data by modifying the bad column register(s) 904 and by re-trying a read so that the skip circuit 802 skips columns based on the modified bad column register(s) 904. In a further embodiment, the correction circuit 806 may output data from the original read operation and may then output data of the retried read operation. In certain embodiments, outputting uncorrected data prior to outputting the corrected data may facilitate detecting a skip inconsistency. For example, the skip inconsistency detection circuit 804 may detect a skip inconsistency based on receiving a UECC signal from the device controller 126.

Figure 10:
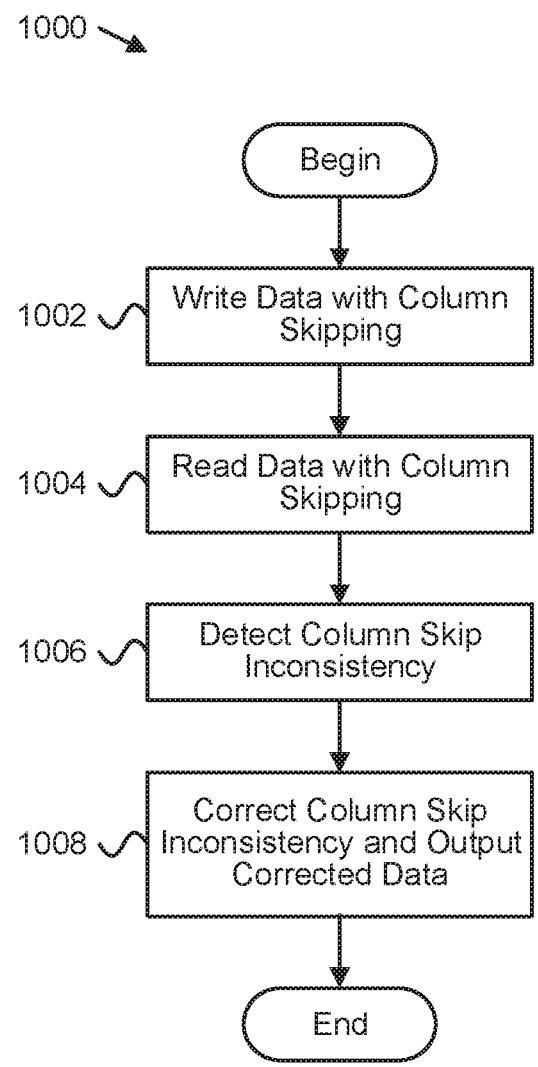
FIG. 10 is a schematic flow chart diagram illustrating one embodiment of a method for skip inconsistency correction.

FIG. 10 is a schematic flow chart diagram illustrating one embodiment of a method 1000 for skip inconsistency correction. The method 1000 begins, and a die controller 206 writes 1002 data to memory cells of an array 200, using a skip circuit 802 to skip faulty columns of the array 200. The die controller 206 reads 1004 data from the array 200, again using the skip circuit 802 to skip faulty columns of the array 200. A skip inconsistency detection circuit 804 detects 1006 a column skip inconsistency in data of the read operation. A correction circuit 806 corrects 1008 the column skip inconsistency and outputs corrected data, and the method 1000 ends.

Figure 11:
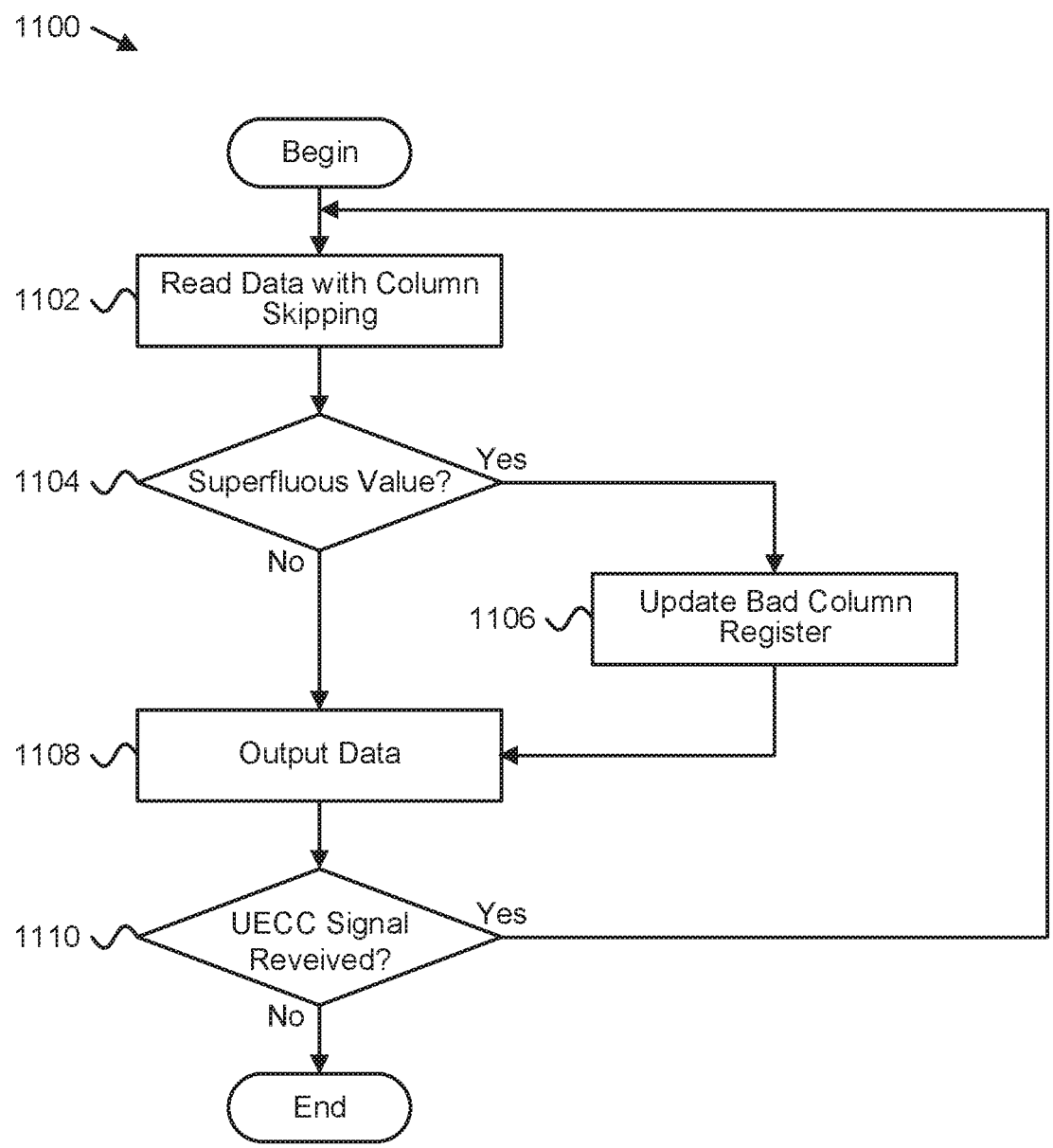
FIG. 11 is a schematic flow chart diagram illustrating another embodiment of a method for skip inconsistency correction.

FIG. 11 is a schematic flow chart diagram illustrating one embodiment of a method 1100 for skip inconsistency correction. The method 1100 begins, and a die controller 206 reads 1102 data from a memory array 200, using a skip circuit 802 to skip faulty columns of the array 200 based on a bad column register 904. A skip inconsistency detection circuit 804 determines 1104 whether the read data includes a superfluous data value. If the read data includes a superfluous data value, a correction circuit 806 updates 1106 the bad column register 904.

The method 1100 continues, and the die controller 206 outputs 1108 the data to a device controller 126. The skip inconsistency detection circuit 804 determines 1110 whether the die controller 206 has received an uncorrectable error correcting code (UECC) signal from the device controller 126. If a UECC signal has not been received, the method 1100 ends. If a UECC signal has been received, the method 1100 returns to the beginning, with the die controller 206 re-reading 1102 data from a memory array 200, using the skip circuit 802 to skip faulty columns of the array 200 based on the updated bad column register 904.

A means for skipping faulty columns of a memory array 200 in read operations and write operations for the memory array 200, in one embodiment, may include a device controller 126, a die controller 206, a skip component 150, a skip circuit 802, a bad column register 904, other logic hardware, and/or other executable code stored on a computer readable storage medium. Other embodiments may include similar or equivalent means for column skipping.

A means for detecting a column skip inconsistency in data of a read operation, in one embodiment, may include a device controller 126, a die controller 206, a skip component 150, a skip inconsistency detection circuit 804, a comparator 914, an array of logic gates, an error-correcting code decoder, other logic hardware, and/or other executable code stored on a computer readable storage medium. Other embodiments may include similar or equivalent means for detecting a column skip inconsistency.

A means for correcting the column skip inconsistency and outputting corrected data, in one embodiment, may include a device controller 126, a die controller 206, a skip component 150, a correction circuit 806, other logic hardware, and/or other executable code stored on a computer readable storage medium. Other embodiments may include similar or equivalent means for correcting the column skip inconsistency and outputting corrected data.

A means for comparing bits of the data to a predefined pattern and/or other bits of the data, in one embodiment, may include a device controller 126, a die controller 206, a skip component 150, a skip inconsistency detection circuit 804, a comparator 914, an array of logic gates, other logic hardware, and/or other executable code stored on a computer readable storage medium. Other embodiments may include similar or equivalent means for comparing data.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
one or more circuits configured to skip memory units for read operations and write operations of a memory array, based on a record of memory units identified as faulty;
wherein the one or more circuits are configured to store superfluous data into a memory unit identified in the record as faulty;
wherein the one or more circuits are configured to detect a skip inconsistency in read data from the memory array, including detect that a value that is within a pre-defined n-bit threshold of deviation from the superfluous data is in the read data from the memory array; and
wherein the one or more circuits are configured to correct the skip inconsistency and output corrected read data.

2. The apparatus of claim 1, wherein the memory unit comprises one or more columns of the memory array.

3. The apparatus of claim 1, wherein the record of memory units identified as faulty comprises a set of column address registers.

4. The apparatus of claim 1, wherein the superfluous data comprises one or more of: a data value matching a pre-defined pattern, and duplicated data values within a pre-defined range of the memory unit.

5. The apparatus of claim 4, wherein the one or more circuits comprise a comparator, the comparator comprising an array of logic gates that compare bits of the read data to one or more of the predefined pattern and other bits of the read data within the predefined range of the memory unit.

6. The apparatus of claim 1, wherein the one or more circuits are configured to output the corrected read data in response to the read data being uncorrectable.

7. The apparatus of claim 6, wherein the one or more circuits determine that the read data is uncorrectable by receiving an uncorrectable error correcting code (UECC) signal from a device controller that receives the read data.

8. The apparatus of claim 1, wherein the one or more circuits are configured to:
store the superfluous data in the memory unit skipped in a write operation and unskipped in a read operation.

9. The apparatus of claim 1, wherein the one or more circuits correct the skip inconsistency by removing the superfluous data from the read data.

10. The apparatus of claim 1, wherein the one or more circuits add a memory unit address to the record of memory units identified as faulty in response to detecting the superfluous data when skipping memory units based on the record of memory units identified as faulty.

11. The apparatus of claim 10, wherein the one or more circuits output the corrected read data by retrying a read operation with the superfluous data removed in response to an uncorrectable error in the read data.

12. The apparatus of claim 1, wherein the one or more circuits detect a plurality of skip inconsistencies in the read data, and the one or more circuits correct the plurality of skip inconsistencies.

13. A system comprising:
a memory die comprising a non-volatile memory array; and
a die controller configured to:
read data stored in memory cells of the array and shift the data stored in the memory cells to avoid bad columns of the array based on a bad column register, comprising not including data in memory cells identified by the bad column register in the shifted data;
detect that a pattern that is indicative of the memory cells being skipped during write is not in the memory cells identified by the bad column register; and
output corrected read data that includes the data in the memory cells identified by the bad column register responsive to the pattern not being in the memory cells identified by the bad column register and the shifted data not being correctable by an error correcting code.

14. The system of claim 13, further comprising a device controller configured to:
receive the shifted data read from the array;
determine that the shifted data read from the array is uncorrectable using an error correcting code; and
send an uncorrectable error correcting code (UECC) signal to the die controller.

15. The system of claim 14, wherein the die controller is configured to detect the pattern in response to receiving the UECC signal.

16. The system of claim 13, wherein the die controller is configured to output the corrected read data by modifying the bad column register and re-reading the data, including removing at least one bad column from the bad column register prior to re-reading the data.

17. An apparatus comprising:
means for skipping faulty columns of a memory array in read operations and write operations for the memory array;
means for storing, into memory cells that are skipped during the write operations, a pattern that is inconsistent with scrambling data;
means for detecting a column skip inconsistency in data of a read operation, including means for detecting that a value that is within a pre-defined n-bit threshold of deviation from the pattern is detected in the data of the read operation; and
means for correcting the column skip inconsistency and outputting corrected data.

18. The apparatus of claim 17, wherein the means for detecting a column skip inconsistency comprise a means for comparing bits of the data of the read operation to one or more of a predefined pattern and other bits of the data that are within a pre-defined column range of a column that contains the bits of the data.

19. The apparatus of claim 1, wherein the one or more circuits are configured to:
erase the memory unit, wherein the superfluous data corresponds to an erased state.

20. The apparatus of claim 1, wherein the one or more circuits are configured to:
store, into the memory unit, a value that is a duplicate of write data stored into a nearby memory unit, wherein the superfluous data is the duplicate of the write data stored into the nearby memory unit.

* * * * *